US012690172B2

(12) United States Patent
Subhash et al.

(10) Patent No.: US 12,690,172 B2
(45) Date of Patent: Jul. 21, 2026

(54) DATA THROUGHPUT USING A METAL BRACKET

(71) Applicant: Micron Technology, Inc., Boise, ID (US)

(72) Inventors: Deepu Narasimiah Subhash, Yeshwanthpu (IN); Suresh Reddy Yarragunta, Bangalore (IN); Koneri Sathyanarayana Guptha Amith, Banaswadi (IN)

(73) Assignee: Micron Technology, Inc., Boise, ID (US)

( * ) Notice: Subject to any disclaimer, the term of this patent is extended or adjusted under 35 U.S.C. 154(b) by 444 days.

(21) Appl. No.: 18/385,191

(22) Filed: Oct. 30, 2023

(65) Prior Publication Data

US 2024/0172398 A1     May 23, 2024

(30) Foreign Application Priority Data

Nov. 22, 2022    (IN) .............................. 202241067040

(51) Int. Cl.
H05K 7/20          (2006.01)
G06F 1/20          (2006.01)
           (Continued)

(52) U.S. Cl.
CPC ............. H05K 7/205 (2013.01); G06F 1/206 (2013.01); H05K 1/0215 (2013.01); (Continued)

(58) Field of Classification Search
USPC ......................................................... 702/99
See application file for complete search history.

(56) References Cited

U.S. PATENT DOCUMENTS

2003/0111213 A1     6/2003   Chang et al.
2003/0202328 A1*   10/2003   Deeney ................. H10W 40/77
                                                          257/E23.101
(Continued)

FOREIGN PATENT DOCUMENTS

WO          2024112594          5/2024

OTHER PUBLICATIONS

"International Application Serial No. PCT US2023 080307, International Search Report mailed Mar. 20, 2024", 3 pages.
(Continued)

*Primary Examiner* — Paul D Lee
(74) *Attorney, Agent, or Firm* — Schwegman Lundberg & Woessner, P.A.

(57)          ABSTRACT

Aspects of the present disclosure configure a memory subsystem processor to use a triangular shaped metal bracket to improve heat dissipation to improve a data transfer rate. The triangular shaped metal bracket being physically attached to an edge of the PCB at a base portion of the triangular shaped metal bracket. The triangular shaped metal bracket is thermally coupled to the set of memory components and the processing device of the PCB via the base portion along with a heat spreader on a primary and secondary side of the bracket. The triangular shaped metal bracket being configured to dissipate heat from the processing device and the set of memory components to at least a host device through a vertex portion of the triangular shaped metal bracket.

20 Claims, 6 Drawing Sheets

(51) Int. Cl.
    *H05K 1/02*           (2006.01)
    *G06F 1/185*        (2026.01)
    *H05K 1/18*           (2006.01)

(52) U.S. Cl.
    CPC ......... *H05K 7/20509* (2013.01); *G06F 1/185*
        (2013.01); *G06F 1/20* (2013.01); *H05K 1/18*
      (2013.01); *H05K 2201/09163* (2013.01); *H05K*
                        *2201/10159* (2013.01)

(56)             References Cited

U.S. PATENT DOCUMENTS

| | | | |
|---|---|---|---|
| 2007/0247814 A1 | 10/2007 | Tseng et al. | |
| 2009/0284929 A1 | 11/2009 | Chen | |
| 2018/0241285 A1* | 8/2018 | Sasaki .................. | H05K 1/0204 |
| 2020/0083144 A1 | 3/2020 | Jin et al. | |
| 2021/0037679 A1* | 2/2021 | Kinsley ............. | H05K 7/20509 |
| 2021/0318822 A1 | 10/2021 | Sloat | |
| 2023/0156900 A1* | 5/2023 | Cavallaro ............... | G06F 1/203 |
| | | | 361/679.54 |

OTHER PUBLICATIONS

"International Application Serial No. PCT US2023 080307, Written Opinion mailed Mar. 20, 2024", 5 pages.

"European Application Serial No. 23895284.0, Response to Communication pursuant to Rules 1612 and 162 EPC filed Nov. 19, 2025", 9 pgs.

\* cited by examiner

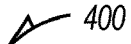 400

410 — MEASURE TEMPERATURE OF AT LEAST ONE OF A PROCESSING DEVICE OR A SET OF MEMORY COMPONENTS IMPLEMENTED ON A PRINTED CIRCUIT BOARD (PCB), A TRIANGULAR SHAPED METAL BRACKET BEING PHYSICALLY ATTACHED TO AN EDGE OF THE PCB AT A BASE PORTION OF THE TRIANGULAR SHAPED METAL BRACKET, THE TRIANGULAR SHAPED METAL BRACKET BEING THERMALLY COUPLED TO THE SET OF MEMORY COMPONENTS AND THE PROCESSING DEVICE OF THE PCB VIA THE BASE PORTION, AND THE TRIANGULAR SHAPED METAL BRACKET BEING CONFIGURED TO DISSIPATE HEAT FROM THE PROCESSING DEVICE AND THE SET OF MEMORY COMPONENTS TO AT LEAST A HOST DEVICE THROUGH A VERTEX PORTION OF THE TRIANGULAR SHAPED METAL BRACKET

415 — ADJUST A DATA TRANSFER RATE BASED ON THE MEASURED TEMPERATURE OF THE AT LEAST ONE OF THE PROCESSING DEVICE OR THE SET OF MEMORY COMPONENTS

*FIG. 4A*

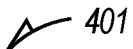

401

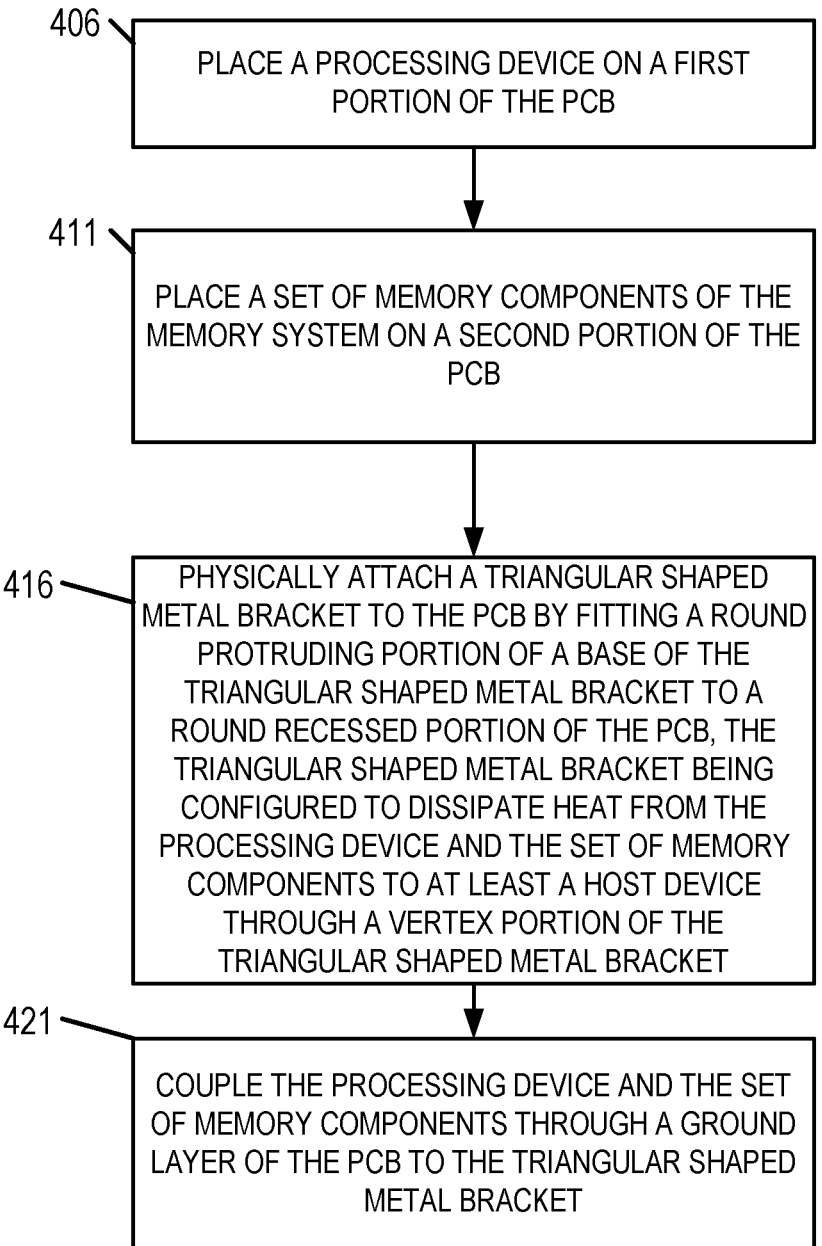

406 — PLACE A PROCESSING DEVICE ON A FIRST PORTION OF THE PCB

411 — PLACE A SET OF MEMORY COMPONENTS OF THE MEMORY SYSTEM ON A SECOND PORTION OF THE PCB

416 — PHYSICALLY ATTACH A TRIANGULAR SHAPED METAL BRACKET TO THE PCB BY FITTING A ROUND PROTRUDING PORTION OF A BASE OF THE TRIANGULAR SHAPED METAL BRACKET TO A ROUND RECESSED PORTION OF THE PCB, THE TRIANGULAR SHAPED METAL BRACKET BEING CONFIGURED TO DISSIPATE HEAT FROM THE PROCESSING DEVICE AND THE SET OF MEMORY COMPONENTS TO AT LEAST A HOST DEVICE THROUGH A VERTEX PORTION OF THE TRIANGULAR SHAPED METAL BRACKET

421 — COUPLE THE PROCESSING DEVICE AND THE SET OF MEMORY COMPONENTS THROUGH A GROUND LAYER OF THE PCB TO THE TRIANGULAR SHAPED METAL BRACKET

*FIG. 4B*

DATA THROUGHPUT USING A METAL BRACKET

PRIORITY APPLICATION

This application claims the benefit of priority to Indian Patent Application Serial Number 202241067040, filed Nov. 22, 2022, which is incorporated herein by reference in its entirety.

TECHNICAL FIELD

Embodiments of the disclosure relate generally to memory sub-systems and, more specifically, to providing heat management and dissipation.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 4A is a flow diagram of an example method to perform data throughput management and heat dissipation, in accordance with some implementations of the present disclosure.

FIG. 4B is a flow diagram of an example method to manufacture a physical assembly of the memory sub-system with a triangular shaped metal bracket, in accordance with some implementations of the present disclosure.

DETAILED DESCRIPTION

Figure 1:
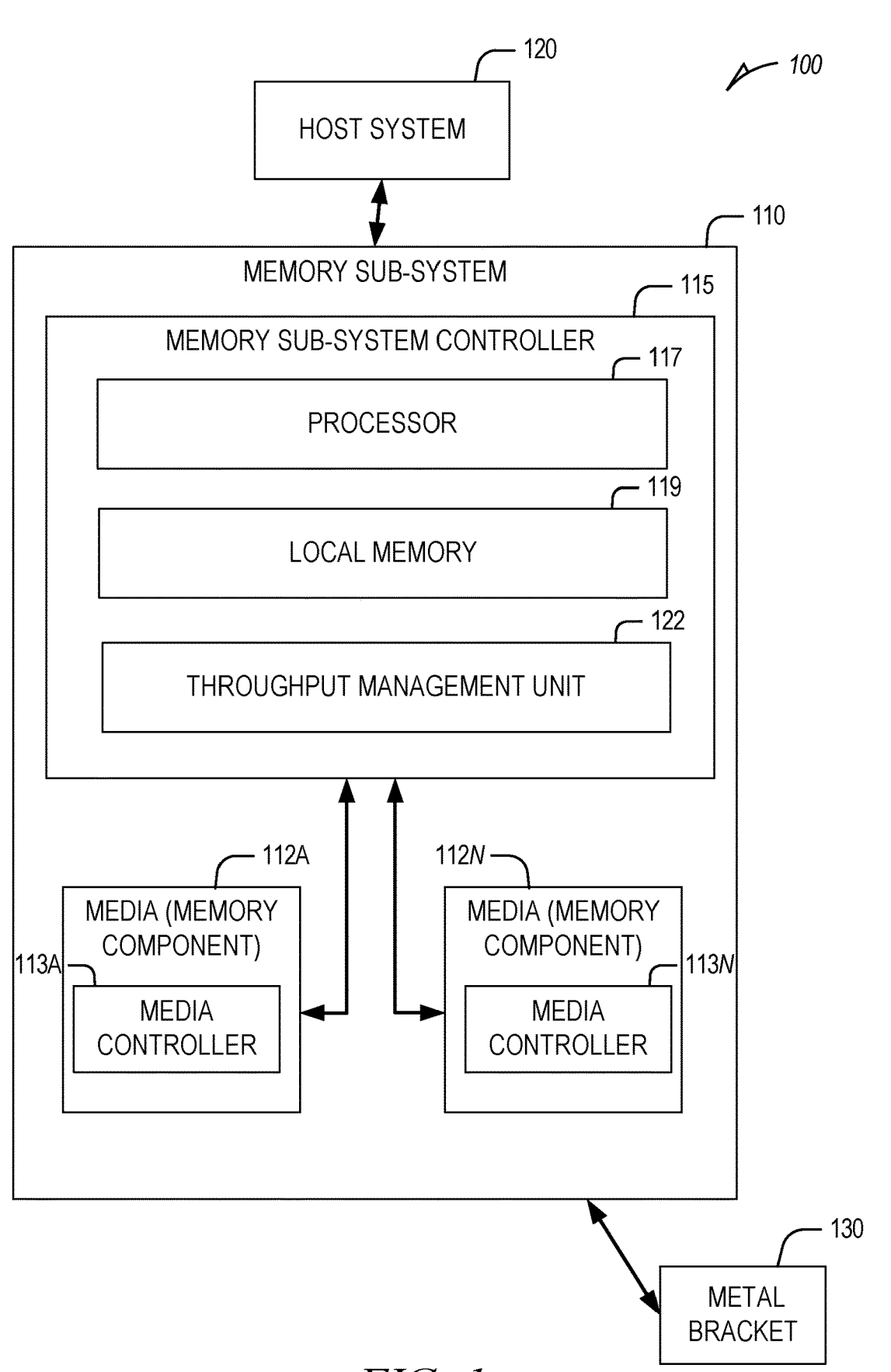
FIG. 1 is a block diagram illustrating an example computing environment including a memory sub-system, in accordance with some embodiments of the present disclosure.

Aspects of the present disclosure configure a system component, such as a memory sub-system processor or controller, such as a power management unit or module, to control data throughput (e.g., transfer between memory components and a host implemented on a motherboard) based on heat that is dissipated through a triangular shaped metal bracket. In response to detecting that the temperature of the processor or the memory transgresses a threshold or reference temperature, the memory sub-system processor or controller adjusts (e.g., throttles or reduces) the data throughput (the rate at which data is exchanged with a host or is transmitted from the processor to an external component) to reduce the temperature. When the temperature no longer transgresses the threshold or reference temperature, the processor or controller increases the data throughput (e.g., increases the rate at which data is exchanged). The temperature can be controlled (minimized or reduced) to prolong when the data throughput will be throttled or adjusted using a triangular shaped metal bracket that is thermally coupled to one of the memory sub-system components, such as the memory controller, memory components, and/or memory cells as well as through one or more heat spreaders that are thermally coupled to the triangular shaped metal bracket and the memory sub-system components. The triangular shaped metal brackets can be coupled through a ground plane of a printed circuit board (PCB) and is configured to dissipate heat similar to a heat sink via a screw to a host device, such as a motherboard. This ensures that performance of the memory system remains optimal and avoids drastic data throughput throttling or reduction with minimal hardware additions. This improves the overall efficiency of operating and implementing the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data."

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data." "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

There are challenges in efficiently managing or performing media management operations on typical memory devices in case of high temperature of the memory device and/or memory controller. Specifically, typical memory subsystems are implemented on a PCB and distribute the components on the PCB in a way that minimizes heat build-up on certain components. Sometimes, specialized hardware, such as heat sinks, can be used that are physically attached to corresponding components to improve heat dissipation and cooling of the components. When the memory device/controller gets too hot (e.g., reaches a temperature that transgresses a threshold temperature), typical devices begin throttling or reducing the data transfer rate and can slow down certain operations in an attempt to lower the operating temperature. While these systems and approaches generally work well, the need to add these large heat sinks to reduce power can consume a great deal of physical real estate on the PCBs and can exceed the maximum allowable dimensions that PCB and the components on the PCB are allowed to reach to properly fit and connect to the host device, such as a motherboard. As a result, fewer memory components can be added and heat sinks cannot always be included which causes the components to reach the threshold temperature very quickly, which reduces the overall data throughput and speed at which the memory sub-systems can operate.

Aspects of the present disclosure address the above and other deficiencies by providing a triangular shaped metal bracket that is thermally coupled to one or more memory components, such as a memory processor and/or memory dies or cells, which can improve heat dissipation and act as a heat sink while not violating any specifications, such as maximum height, width, and length limits or PCB space restrictions. The triangular shaped metal bracket can collect heat dissipated by the memory components by being coupled via a ground layer of the PCB and transferring the heat to the air and to the host device, such as the motherboard, to which the triangular shaped metal bracket is screwed into and to which the memory components are connected, such as through an interface (e.g., an M.2 interface). This provides a heat sink for the various components on the PCB without having to directly place the heat sink on top of individual components which would violate certain specifications and restrictions. In this way, the operating temperature of the memory system can be maintained at a relative lower level (e.g., below the threshold temperature) for longer periods of time than typical systems which can prolong, delay or prevent throttling of the data throughput and reduction in performance of the memory systems. This increases the efficiency of operating memory systems and can reduce the amount of physical resources consumed by the memory sub-systems.

In addition, the triangular shaped metal bracket can be physically coupled to the PCB and is shaped to ensure that the PCB that implements the memory components can meet the physical specifications of the underlying host device and reduces a number of mounting holes in the motherboard. For example, the triangular shaped metal bracket can be formed of a certain length to extend a length of the PCB to meet a minimum length of a slot corresponding to the host device. Namely, the host device can include a memory slot that is 80 millimeters in length while the PCB is only 30 millimeters or 42 millimeters in length. In such cases, the triangular shaped metal bracket can be formed to be 50 millimeters or 38 millimeters and attached to the PCB in a flush manner to ensure that the PCB and triangular shaped metal bracket securely and properly fit in the 80 millimeter memory slot. The triangular shaped metal bracket, in addition to providing heat dissipation to the host device, can reduce shock to the PCB by absorbing some amount of shock and also increases the stiffness of the PCB which improves the overall reliability of the memory components implemented on the PCB.

In some examples, a system including: a PCB that implements a set of memory components of a memory sub-system and a processing device operatively coupled to the set of memory components is provided. The system includes a triangular shaped metal bracket including a base portion and a vertex portion. The triangular shaped metal bracket is physically attached to an edge of the PCB at the base portion and is thermally coupled to the set of memory components and the processing device of the PCB via the base portion. The triangular shaped metal bracket is configured to dissipate heat from the processing device and the set of memory components to at least a host device through the vertex portion, such as via one or more screws that connect the triangular shaped metal bracket to the host device. The processing device is configured to perform operations including: measuring temperature of at least one of the processing device or the set of memory components and adjusting a data transfer rate based on the measured temperature of the at least one of the processing device or the set of memory components.

In some examples, the PCB includes an M.2 interface through which the set of memory components and the processing device communicate with the host device, the M.2 interface being implemented on the PCB on an opposite end from the edge of the PCB to which the triangular shaped metal bracket is physically attached. In some examples, the PCB includes a plurality of layers including a ground layer. The set of memory components and the processing device are both coupled to the triangular shaped metal bracket through the ground layer. In some examples, the triangular shaped metal bracket is physically attached to the edge of the PCB using a thermal epoxy.

In some examples, the edge of the PCB includes a round recessed portion and the base portion of the triangular shaped metal bracket includes a round protruding portion. The round protruding portion is configured to securely fit within the round recessed portion to physically attach the triangular shaped metal bracket to the edge of the PCB. In some examples, a size of the base portion of the triangular shaped metal bracket corresponds to a width of the PCB measured from first and second sides of the PCB that are adjacent to the edge of the PCB.

In some examples, a length of the PCB measured between another edge of the PCB that is opposite and the edge of the PCB corresponds to a first length that is smaller than a minimum length associated with a slot of the host device. In some aspects, a height of the triangular shaped metal bracket measured between the base portion and the vertex portion when combined with the length of the PCB corresponds to the minimum length associated with the slot. Namely a sum of the height of the triangular shaped metal bracket and the length of the PCB matches the length associated with the memory slot of the motherboard. In some examples, the minimum length is 80 millimeters and the length of the PCB is 30 millimeters or 42 millimeters.

In some examples, the vertex portion is configured to be physically attached to the host device via a screw and is configured to dissipate heat to the host device via the screw. In some aspects, the triangular shaped metal bracket is configured to increase a stiffness of the PCB and absorb shock. In some aspects, the triangular shaped metal bracket includes a heat sink. In some examples, a heat spreader is thermally coupled to one or more components of the PCB and is thermally coupled to the triangular shaped metal bracket via the base portion. In some aspects, the heat spreader is thermally coupled to the one or more components of the PCB via a top portion of the PCB. In some aspects, the heat spreader is a first heat spreader. In such cases, a second heat spreader is thermally coupled to a bottom portion of the PCB and is thermally coupled to the triangular shaped metal bracket via the base portion.

In some examples, the techniques described herein relate to a method of manufacturing a PCB including a memory system. The method includes placing a processing device on a first portion of the PCB and placing a set of memory components of the memory system on a second portion of the PCB. The method includes physically attaching a triangular shaped metal bracket to the PCB by fitting a round protruding portion of a base of the triangular shaped metal bracket to a round recessed portion of the PCB, the triangular shaped metal bracket being configured to dissipate heat from the processing device and the set of memory components to at least a host device through a vertex portion of the triangular shaped metal bracket. The method includes coupling the processing device and the set of memory components through a ground layer of the PCB to the triangular shaped metal bracket.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies). These individual dies can be coupled to each other on an integrated circuit and placed as separate or combined components on a PCB.

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 (e.g., a motherboard) that is coupled to a memory system. The memory system can include one or more memory sub-systems 110. In some embodiments, the host system 120 is coupled to different types of memory sub-systems 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), a motherboard, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, an M.2 SSD interface, etc. The M.2 SSD interface can have certain minimum physical size specifications for a memory slot to connect to the host device. The minimum physical size can be 22×80 millimeters.

The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface and/or M.2 SSD interface. The physical host interface can provide an interface for passing control, address, data, and other signals between the memory sub-system 110 and the host system 120. The memory sub-system 110 can be implemented on a PCB that is coupled to the host system 120 via a specified interface, such as the M.2 SSD interface. In some cases, the PCB on which the memory sub-system 110 is implemented is smaller than a length of the memory slot of the M.2 SSD interface of the host device. In such cases, the triangular shaped metal bracket can be attached physically to the PCB to extend the length of the PCB to fit snuggly and securely in the memory slot of the M.2 SSD interface of the host device. In addition to allowing smaller form factor memory systems implemented on the PCB to be coupled to the host device, the triangular shaped metal bracket also helps with heat dissipation from the PCB to the host device and durability of the PCB. By being shaped in a triangle, heat is collected from a base portion coupled to the PCB and distributed and focused on the apex or vertex portion of the triangle to which the triangular shaped metal bracket is connected to the host device. This maximizes the heat dissipation to a particular physical point that is configured to receive maximum heat dissipation.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random-access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh.

The memory sub-system controller 115 can include hardware such as one or more integrated circuits and/or discrete components, a throughput management unit 122, a metal bracket 130 (e.g., a triangular shaped metal bracket), a buffer memory, and/or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode with instructions for the memory sub-system controller 115 to execute, such as firmware. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other memory management operations, such as wear leveling operations, garbage collection operations, error detection and error-correcting code (ECC) operations, encryption operations, caching operations, memory components 112A to 112N initialization, and/or address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120. The memory sub-system controller 115 can include a memory interface to communicate with the memory components 112A to 112N. Any component included as part of the memory sub-system controller 115 can be included in the memory interface and vice versa.

The memory sub-system 110 can also include additional circuitry or components that are not illustrated, such as capacitors, resistors, transistors, and various other active or passive devices. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which are raw memory devices combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a throughput management unit 122 that is coupled to a metal bracket 130. In some cases, the throughput management unit 122 can be a separate physical component from the components of the memory sub-system controller 115. In some cases, the throughput management unit 122 and the components of the memory sub-system controller 115 are implemented by the same physical device or integrated circuit. The metal bracket 130 is a separate physical device from the throughput management unit 122 and/or the memory sub-system controller 115. The metal bracket 130 is physically and thermally connected and coupled to a PCB on which the memory sub-system 110 is implemented. For example, the metal bracket 130 can be triangular in shape where a base of the triangle is of a size that corresponds or matches the width of the PCB and connects in a flush manner to an edge of the PCB. The metal bracket 130 includes an apex or vertex at an opposite end from the base of the triangle where a screw joins or physically attaches the metal bracket 130 to the host system 120 (e.g., motherboard). The metal bracket 130 implements a heat sink (which can be an active or passive heatsink) that is configured to draw or receive heat from one of the components of the memory sub-system 110 and dissipate such heat to at least the air or other fluid or gas to cool components of the memory sub-system 110 and/or the host system 120 via one or more screws the connect the metal bracket 130 to the host system 120.

In one example, the metal bracket 130 can be implemented by a triangular shaped metal bracket that is coupled to a ground layer of the PCB on which the memory sub-system 110 is implemented. Heat can be transferred via the ground layer to the metal bracket 130 and dissipated to the host system 120 and/or external fluid or gas. In this way, the metal bracket 130 acts as a remote heat sink and temperature of the memory sub-system 110 can be reduced or maintained at a relatively low level to prevent the throughput management unit 122 from reducing throughput of the memory sub-system 110 in response to detecting that the temperature of one or more components of the memory sub-system 110 transgresses a temperature threshold or reference temperature. This keeps the data rate operating at the optimal or maximum level which improves the overall efficiency and functioning of the device. In some examples, the metal bracket 130 can collect heat dissipated by one or more components of the memory sub-system controller 115 and/or the memory sub-system 110, such as the memory components 112A to 112N, and can convert the dissipated heat it collects into electrical energy or power to return the power back to one or more devices or components. This increases the efficiency of operating memory systems and reduces the amount of physical resources consumed by the memory sub-systems.

Depending on the embodiment, the throughput management unit 122 can comprise logic (e.g., a set of transitory or non-transitory machine instructions, such as firmware) or one or more components that causes the throughput management unit 122 to perform operations described herein. The throughput management unit 122 can comprise a tangible or non-tangible unit capable of performing operations described herein.

For example, the throughput management unit 122 can be configured to accesses a reference temperature for controlling data transfer throughput (data transfer rate between a host and the memory sub-system). The throughput management unit 122 measures temperature of at least one of the processing device or the set of memory components using a temperature sensor (not shown). Heat associated with the at least one of the components of the memory sub-system 110 can be dissipated at least in part through the metal bracket 130 (which can include one or more heat spreaders) that is thermally coupled to the processing device and the set of memory components. The throughput management unit 122 adjusts or reduces the data transfer throughput in response to determining that the measured temperature transgresses the reference temperature. The throughput management unit 122 adjusts or increases the data transfer throughput in response to determining that the measured temperature no longer or fails to transgress the reference temperature.

In some examples, a PCB is provided on which the set of memory components, the processing device (and various other components of the memory sub-system 110) are implemented. In some examples, the PCB includes a plurality of layers each accessible through one or more vias, the plurality of layers including a ground layer. The metal bracket 130 is external to the PCB and is coupled to the PCB to help with heat dissipation and to ensure that the PCB properly and snuggly fits in a memory slot of the host system 120 by adding length to the PCB in an amount corresponding to a length or height of the metal bracket 130. The set of memory components and the processing device are both coupled to the metal bracket 130 through the ground layer where heat is dissipated to the metal bracket 130 via the ground layer.

In some examples, the metal bracket 130 is coupled to the ground layer through the one or more vias, such as thermal vias or holes drilled into the PCB. In some aspects, the throughput management unit 122 is implemented by a physical chip having a specified height relative to a top layer of the PCB. A height of the metal bracket 130 can be less than or equal to the specified height of the physical chip. In some examples, the set of memory components is implemented by a physical chip having a specified height relative to a top layer of the PCB. A height of the metal bracket 130 can be less than or equal to the specified height of the physical chip. In some examples, the specified height includes 1.5 millimeters or less.

In some examples, the PCB includes an M.2 interface through which the set of memory components and the throughput management unit 122 communicate with the host system 120. The metal bracket 130 can be connected to the PCB on an opposite end of the M.2 interface, as shown in more detail below in FIGS. 2 and 3. In some examples, the metal bracket 130 includes a heat sink.

Figure 2:
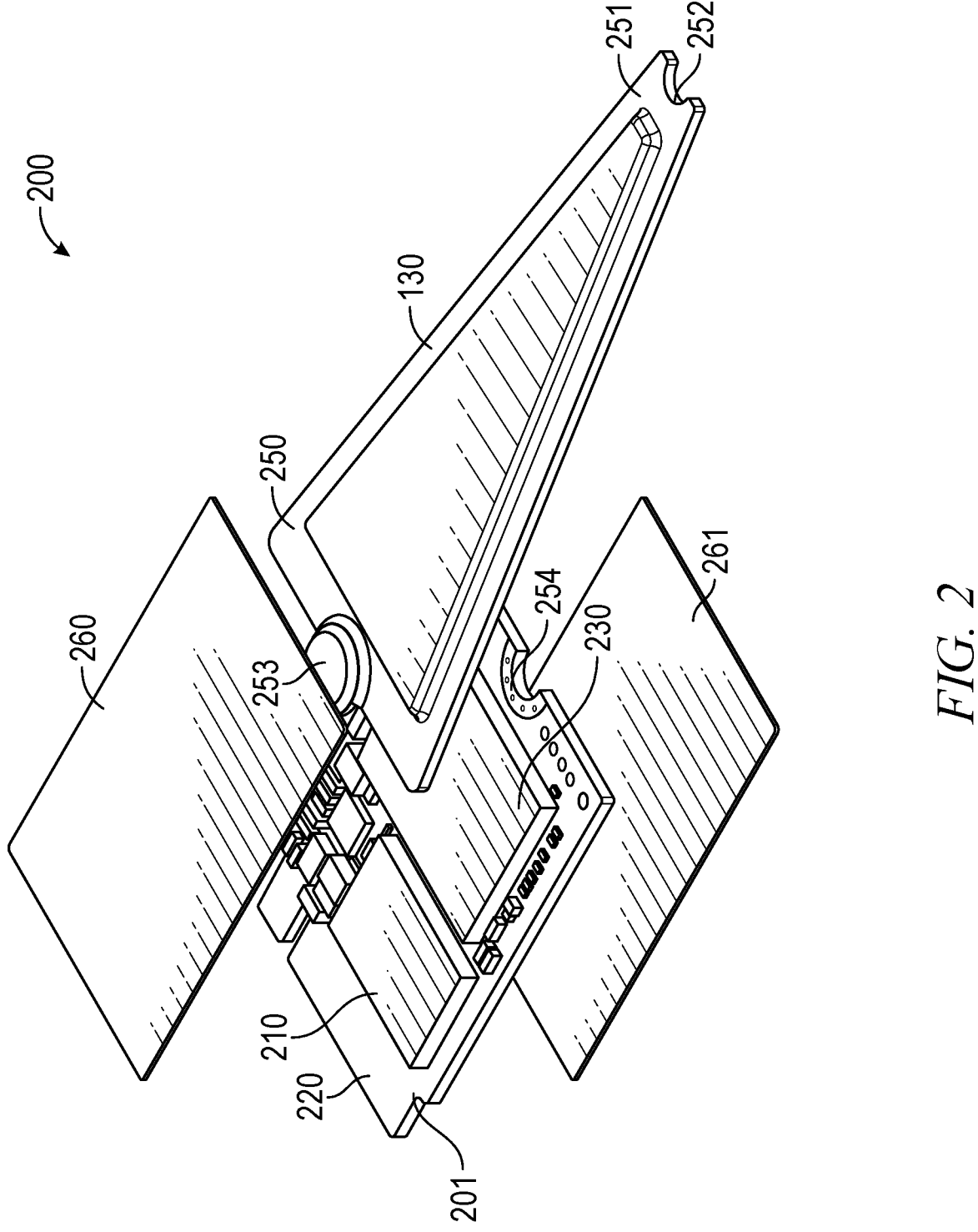
FIG. 2 is a diagram of an example physical assembly of the memory sub-system with a triangular shaped metal bracket, in accordance with some implementations of the present disclosure.

FIG. 2 is a diagram of an example physical assembly 200 including the metal bracket 130 and a PCB 201 on which the memory sub-system 110 is implemented, in accordance with some implementations of the present disclosure. The PCB 201 includes an interface 220 (e.g., an M.2 interface), a control component 210, a memory component 230. The metal bracket 130 that is part of the physical assembly 200 can be triangular in shape where a base portion 250 is physically coupled to the PCB 201 at an edge of the PCB 201. The metal bracket 130 includes a vertex or apex portion 251 where a screw can be connected at a point 252 to the underlying host system 120.

The control component 210 can include a physical chip or integrated circuit package in which any one of the components of the memory sub-system 110 can be implemented, such as the memory sub-system controller 115. The memory component 230 can include one or more physical chips or integrated circuit packages in which any one of the memory components 112 is implemented. The memory sub-system 110 communicates with the host system 120 via the interface 220. In some cases, the memory sub-system 110 communicates with the host system 120 at a first throughput or data rate. When the throughput management unit 122 determines that a temperature of the control component 210 and/or the memory component 230 reaches or transgresses a temperature threshold or reference temperature, the throughput management unit 122 can throttle or reduce the data rate so that the memory sub-system 110 communicates with the host system 120 at a second throughput or data transfer rate. This allows the throughput management unit 122 to reduce the operating temperature of the memory sub-system 110 to continue operating without having to shut down any component.

In order to increase the amount of time it takes the memory sub-system 110 to reach the temperature threshold or reference temperature from an ambient temperature, the PCB is connected to the metal bracket 130. The metal bracket 130 is thermally coupled physically via a ground layer or other internal metal layer of the PCB to one or more of the control component 210, memory component 230 and/or the interface 220 via the recessed connection 254.

In some examples, the recessed connection 254 can be formed by placing a notch at an end of the PCB 201 that is rounded out to form a semicircular connection with a specified diameter. The recessed connection 254 can be electrically connected to one or more ground layers of the PCB 201. The metal bracket 130 can include a protruding portion 253 that is round in shape to form a semicircular connection with a specified diameter. The diameter of the protruding portion 253 can match the diameter of the recessed connection 254 this allows the metal bracket 130 to snuggly and securely connect in a flush manner to the PCB 201. Once the metal bracket 130 is physically attached to the PCB 201, a thermal epoxy is placed on the protruding portion 253 and the 254 to securely attach the metal bracket 130 to the PCB 201.

In some examples, the physical assembly 200 includes a first heat spreader 260 and a second heat spreader 261. The first heat spreader 260 can be placed on top of the PCB 201 to physically touch one or more physical components of the PCB 201 on a top layer of the PCB 201. The first heat spreader 260 also couples thermally to the metal bracket 130, such as via a top portion of the protruding portion 253. This further allows the components on the PCB 201 to dissipate heat and transfer heat through the first heat spreader 260 to the metal bracket 130 and then to the host system 120. In this way, heat can be dissipated through the ground plane electrically and thermally through the PCB 201 and through an external physical contact with the first heat spreader 260.

The second heat spreader 261 can be placed on a bottom portion of the PCB 201 to physically touch one or more physical components of the PCB 201 from the bottom. The second heat spreader 261 also couples thermally to the metal bracket 130, such as via a bottom portion of the protruding portion 253. This further allows the components on the PCB 201 to dissipate heat and transfer heat through the second heat spreader 261 to the metal bracket 130 and then to the host system 120. In this way, heat can be dissipated through the ground plane electrically and thermally through the PCB 201 and through an external physical contact with the second heat spreader 261.

Figure 3:
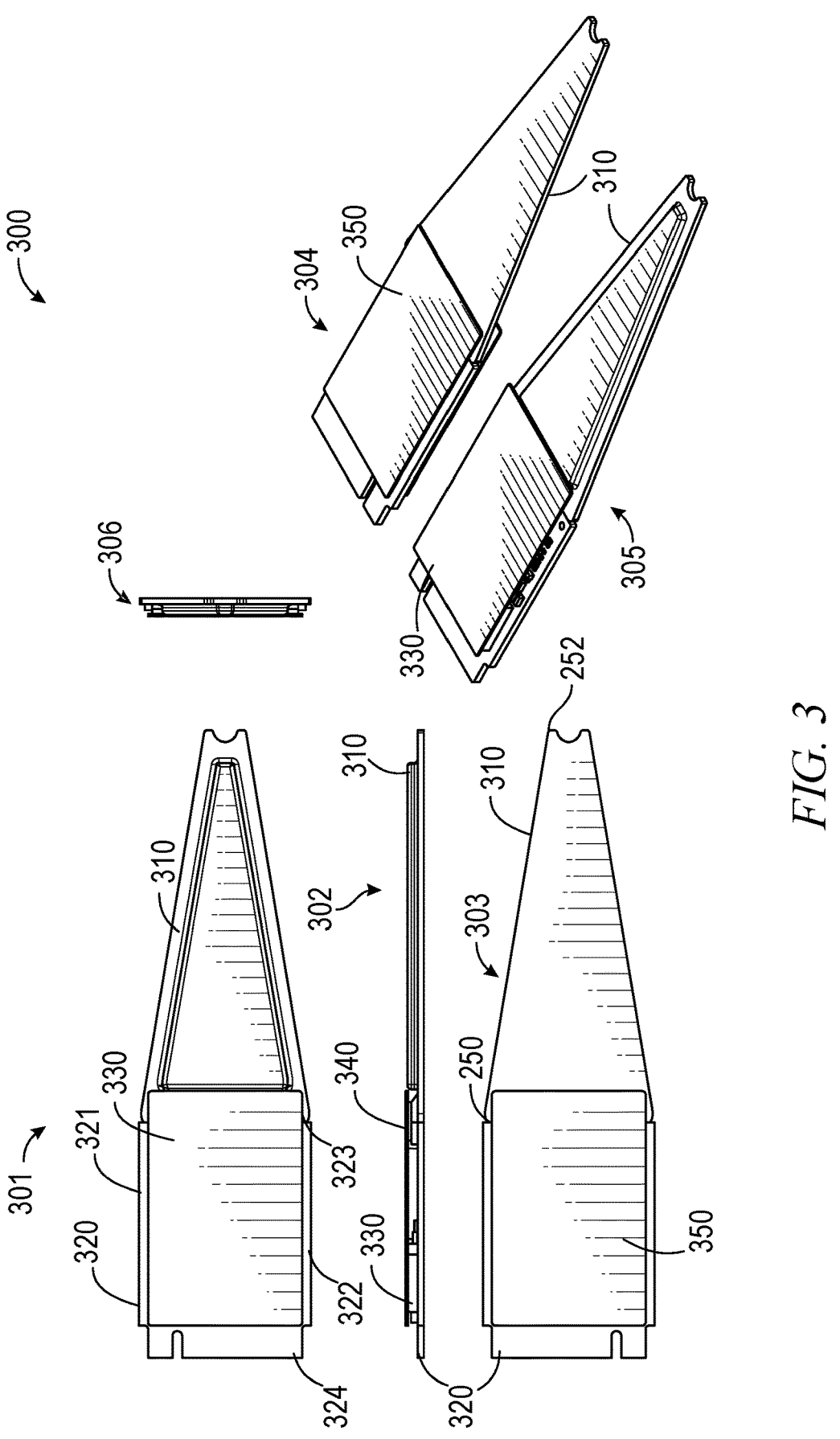
FIG. 3 is a block diagram of different views of the example physical assembly of the memory controller with the triangular shaped metal bracket, in accordance with some implementations of the present disclosure.

FIG. 3 is a block diagram of different views 300 of the example physical assembly 200 of the memory controller with the triangular shaped metal bracket 130, in accordance with some implementations of the present disclosure. FIG. 3 shows a top down view 301 of the physical assembly 200, a side view 302 of the physical assembly 200, a bottom up view 303 of the physical assembly 200, a perspective top view 305 of the physical assembly 200, a perspective bottom view 304 of the physical assembly 200, and a cross-sectional view 306 of the physical assembly 200.

As shown in top down view 301, the physical assembly 200 includes a PCB 320 (which corresponds to the PCB 201 from FIG. 2), a first heat spreader 330 (corresponding to the first heat spreader 260), and the triangular shaped metal bracket 310 (corresponding to metal bracket 130). As shown in side view 302, the first heat spreader 330 physically couples to the triangular shaped metal bracket 310 via a top portion 340 of the protruding portion 253 (FIG. 2). The PCB 320 includes an interface at an opposite end from the edge or point at which the PCB 320 is coupled to the triangular shaped metal bracket 310 for coupling the PCB 320 electronically to the host system 120.

As shown in bottom up view 303, the physical assembly 200 includes a second heat spreader 350 (corresponding to the second heat spreader 261), and the triangular shaped metal bracket 310 (corresponding to metal bracket 130). The second heat spreader 350 couples to the triangular shaped metal bracket 310 via a bottom portion of the protruding portion 253 (FIG. 2). The first heat spreader 330 and the second heat spreader 350 can cover only a portion or less than all of the PCB 320.

The PCB 320 can be of a certain width that is measured from a first side 321 and a second side 322 of the PCB 320 that are adjacent to the edge 323 of the PCB 320 where the PCB 320 connects to the triangular shaped metal bracket 310. Namely, the width of the PCB 320 is the distance between the first and second sides 321/322 and corresponds to a width of a base portion of the triangular shaped metal bracket 310. A length of the PCB 320 is measured between another edge 324 of the PCB (where the interface of the PCB 320 is placed) that is opposite and the edge 323 of the PCB which connects to the triangular shaped metal bracket 310. The length of the PCB 320 can be a first length that is smaller than a minimum length associated with a slot of the host system 120. For example, the first length can be 30 millimeters or 42 millimeters and the minimum length associated with a slot of the host system 120 can be 80 millimeters.

The size of the base portion of the triangular shaped metal bracket 310 which connects to the PCB 320 can be the same as the width of the PCB 320. A top of the triangular shaped metal bracket 310 can correspond to the vertex or apex of the triangular shaped metal bracket 310 which can be smaller than the size of the base portion. The distance between the point 252 and the base portion 250 of the triangular shaped metal bracket 310 can be specified to allow the PCB 320 to have a length that is long enough to fit in the slot of the host system 120 which can be 80 millimeters. Namely, the height of the triangular shaped metal bracket 310 can be made so that when combined with the length of the PCB 320 matches the size of the slot of the host system 120.

FIG. 4A is a flow diagram of an example method to perform data throughput management and heat dissipation, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the throughput management unit 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4A, the method (or process) 400 begins at operation 410, with a throughput management unit 122 of a memory sub-system (e.g., memory sub-system 110) measuring temperature of at least one of a processing device or a set of memory components implemented on a PCB where a triangular shaped metal bracket is physically attached to an edge of the PCB at a base portion of the triangular shaped metal bracket. The triangular shaped metal bracket is thermally coupled to the set of memory components and the processing device of the PCB via the base portion is configured to dissipate heat from the processing device and the set of memory components to at least a host device (e.g., a motherboard) through a vertex portion of the triangular shaped metal bracket. Then, at operation 415, the throughput management unit 122 adjusts a data transfer rate based on the measured temperature, such as by comparing the measured temperature with a reference temperature and by reducing the data transfer rate in response to determining that the temperature transgresses (exceeds by more than a specified amount) the reference temperature.

FIG. 4B is a flow diagram of an example method to manufacture a physical assembly of the memory sub-system with a triangular shaped metal bracket, in accordance with some implementations of the present disclosure. The method 401 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4B, the method (or process) 401 begins at operation 406, with a processing device being placed on a first portion of a PCB and, at operation 411, a set of memory components 112 being placed on a second portion of the PCB. Then, a metal bracket 130 is physically attached to the PCB by fitting a round protruding portion of a base of the metal bracket 130 to a round recessed portion of the PCB at operation 416. The metal bracket 130 is configured to dissipate heat from the processing device and the set of memory components to at least a host device through a vertex portion of the triangular shaped metal bracket. At operation 421, the processing device and the set of memory components are coupled through a ground layer of the PCB to the metal bracket 130.

In view of the disclosure above, various examples are set forth below. It should be noted that one or more features of an example, taken in isolation or combination, should be considered within the disclosure of this application.

Example 1. A system comprising: a printed circuit board (PCB) comprising: a set of memory components of a memory sub-system; and a processing device operatively coupled to the set of memory components; and a triangular shaped metal bracket comprising a base portion and a vertex portion, the triangular shaped metal bracket being physically attached to an edge of the PCB at the base portion, the triangular shaped metal bracket being thermally coupled to the set of memory components and the processing device of the PCB via the base portion, and the triangular shaped metal bracket being configured to dissipate heat from the processing device and the set of memory components to at least a host device through the vertex portion, wherein the processing device is configured to perform operations comprising: measuring temperature of at least one of the processing device or the set of memory components; and adjusting a data transfer rate based on the measured temperature of the at least one of the processing device or the set of memory components.

Example 2. The system of Example 1, wherein a PCB comprises an M.2 interface through which the set of memory components and the processing device communicate with the host device, the M.2 interface being implemented on the PCB on an opposite end from the edge of the PCB to which the triangular shaped metal bracket is physically attached.

Example 3. The system of any one of Examples 1-2, wherein the PCB includes a plurality of layers, the plurality of layers comprising a ground layer, and wherein the set of memory components and the processing device are both coupled to the triangular shaped metal bracket through the ground layer.

Example 4. The system of any one of Examples 1-3, wherein the triangular shaped metal bracket is physically attached to the edge of the PCB using a thermal epoxy.

Example 5. The system of any one of Examples 1-4, wherein the edge of the PCB comprises a round recessed portion, wherein the base portion of the triangular shaped metal bracket comprises a round protruding portion, and wherein the round protruding portion is configured to fit within the round recessed portion to physically attach the triangular shaped metal bracket to the edge of the PCB.

Example 6. The system of Example 5, wherein a size of the base portion of the triangular shaped metal bracket corresponds to a width of the PCB measured from first and second sides of the PCB that are adjacent to the edge of the PCB.

Example 7. The system of any one of Examples 5-6, wherein a length of the PCB measured between another edge of the PCB that is opposite and the edge of the PCB corresponds to a first length that is smaller than a minimum length associated with a slot of the host device.

Example 8. The system of Example 7, wherein a height of the triangular shaped metal bracket measured between the base portion and the vertex portion when combined with the length of the PCB corresponds to the minimum length associated with the slot.

Example 9. The system of any one of Examples 7-8, wherein the minimum length comprises 80 millimeters, and wherein the length of the PCB comprises 30 millimeters or 42 millimeters.

Example 10. The system of any one of Examples 1-9, wherein the vertex portion is configured to be physically attached to the host device via a screw and is configured to dissipate heat to the host device via the screw.

Example 11. The system of any one of Examples 1-10, wherein the triangular shaped metal bracket is configured to increase a stiffness of the PCB and absorb shock.

Example 12. The system of any one of Examples 1-11, wherein the triangular shaped metal bracket comprises a heat sink.

Example 13. The system of any one of Examples 1-12, comprising: a heat spreader thermally coupled to one or more components of the PCB and thermally coupled to the triangular shaped metal bracket via the base portion.

Example 14. The system of Example 13, wherein the heat spreader is thermally coupled to the one or more components of the PCB via a top portion of the PCB.

Example 15. The system of Example 14, wherein the heat spreader is a first heat spreader, comprising a second heat spreader thermally coupled to a bottom portion of the PCB and thermally coupled to the triangular shaped metal bracket via the base portion.

Example 16. A method comprising: measuring temperature of at least one of a processing device or a set of memory components implemented on a printed circuit board (PCB), a triangular shaped metal bracket being physically attached to an edge of the PCB at a base portion of the triangular shaped metal bracket, the triangular shaped metal bracket being thermally coupled to the set of memory components and the processing device of the PCB via the base portion, and the triangular shaped metal bracket being configured to dissipate heat from the processing device and the set of memory components to at least a host device through a vertex portion of the triangular shaped metal bracket; and adjusting a data transfer rate based on the measured temperature of the at least one of the processing device or the set of memory components.

Example 17. The method of Example 16, wherein a PCB comprises an M.2 interface through which the set of memory components and the processing device communicate with the host device, the M.2 interface being implemented on the PCB on an opposite end from the edge of the PCB to which the triangular shaped metal bracket is physically attached.

Example 18. The method of any one of Examples 16-17, wherein the PCB includes a plurality of layers, the plurality of layers comprising a ground layer, and wherein the set of memory components and the processing device are both coupled to the triangular shaped metal bracket through the ground layer.

Example 19. The method of any one of Examples 16-18, wherein the triangular shaped metal bracket is physically attached to the edge of the PCB using a thermal epoxy.

Example 20. A method of manufacturing a PCB comprising a memory system, the method comprising: placing a processing device on a first portion of the PCB; placing a set of memory components of the memory system on a second portion of the PCB; physically attaching a triangular shaped metal bracket to the PCB by fitting a round protruding portion of a base of the triangular shaped metal bracket to a round recessed portion of the PCB, the triangular shaped metal bracket being configured to dissipate heat from the processing device and the set of memory components to at least a host device through a vertex portion of the triangular shaped metal bracket; and coupling the processing device and the set of memory components through a ground layer of the PCB to the triangular shaped metal bracket.

Methods and computer-readable storage medium with instructions for performing any one of the above examples.

Figure 5:
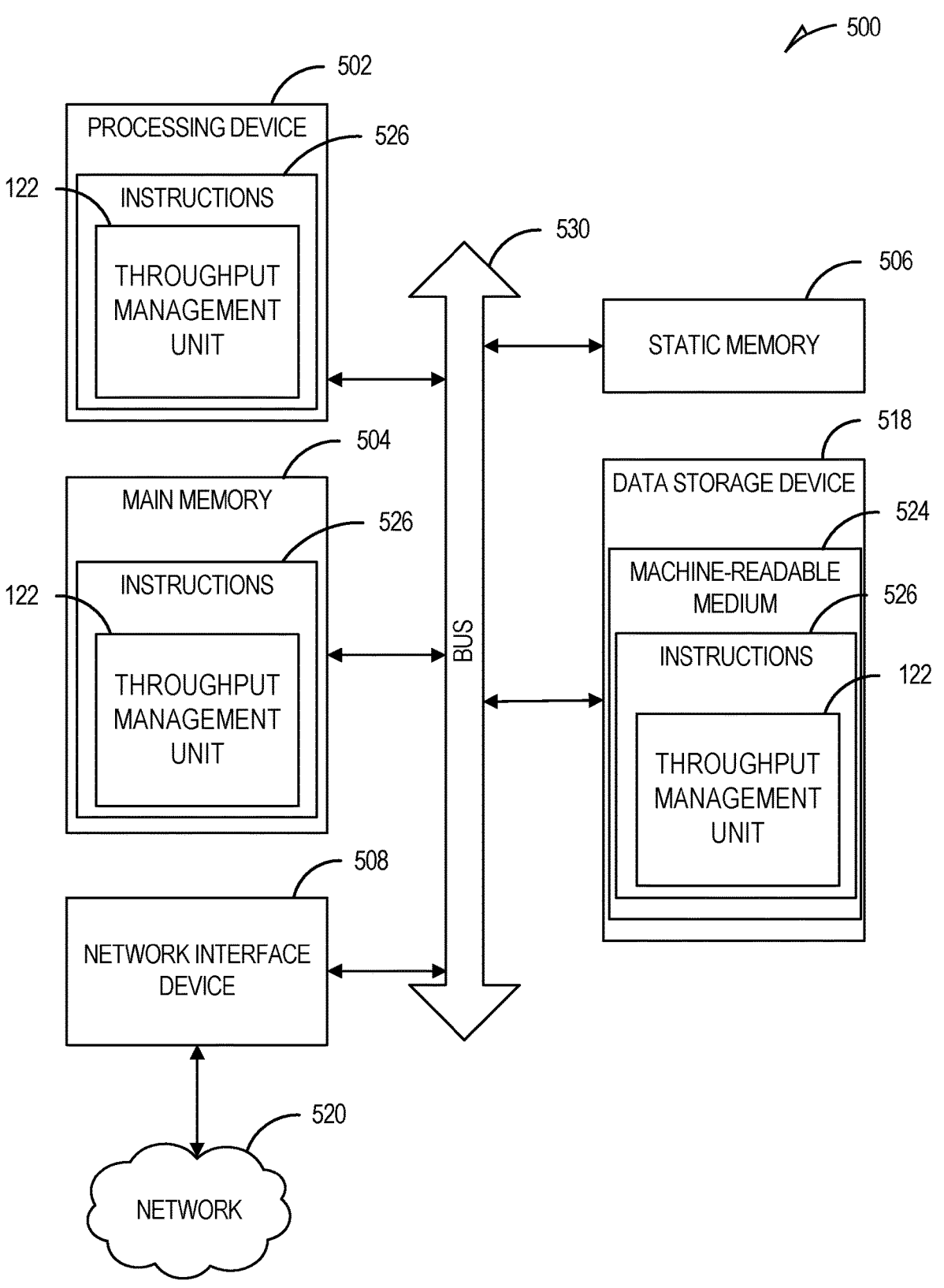
FIG. 5 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the throughput management unit 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage device 518 can include a machine-readable storage medium 524 (also known as a computer-readable medium) on which is stored one or more sets of instructions 526, or software embodying any one or more of the methodologies or functions described herein. The instructions 526 can also reside, completely or partially, within the main memory 504 and/or within the processing device 502 during execution thereof by the computer system 500, the main memory 504 and the processing device 502 also constituting machine-readable storage media. The machine-readable storage medium 524, data storage device 518, and/or main memory 504 can correspond to the memory sub-system 110 of FIG. 1.

In one embodiment, the instructions 526 implement functionality corresponding to the throughput management unit 122 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a method according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a printed circuit board (PCB) comprising:
   a set of memory components of a memory sub-system; and
   a processing device operatively coupled to the set of memory components; and
a metal bracket comprising a base portion and a vertex portion, the metal bracket being physically attached to an edge of the PCB at the base portion, the metal bracket being thermally coupled to the set of memory components and the processing device of the PCB via the base portion, and the metal bracket being configured to dissipate heat from the processing device and the set of memory components through the vertex portion,
wherein the processing device is configured to perform operations comprising:
   measuring temperature of at least one of the processing device or the set of memory components; and
   adjusting a data transfer rate based on the measured temperature of the at least one of the processing device or the set of memory components.

2. The system of claim 1, wherein a PCB comprises an M.2 interface through which the set of memory components and the processing device communicate with a host device, the M.2 interface being implemented on the PCB on an opposite end from the edge of the PCB to which the metal bracket is physically attached.

3. The system of claim 1, wherein the PCB includes a plurality of layers, the plurality of layers comprising a ground layer, and wherein the set of memory components and the processing device are both coupled to the metal bracket through the ground layer.

4. The system of claim 1, wherein the metal bracket is a triangular shaped metal bracket, and wherein the triangular shaped metal bracket is physically attached to the edge of the PCB using a thermal epoxy.

5. The system of claim 1, wherein the edge of the PCB comprises a round recessed portion, wherein the base portion of the metal bracket comprises a round protruding portion, and wherein the round protruding portion is configured to fit within the round recessed portion to physically attach the metal bracket to the edge of the PCB.

6. The system of claim 5, wherein a size of the base portion of the metal bracket corresponds to a width of the PCB measured from first and second sides of the PCB that are adjacent to the edge of the PCB.

7. The system of claim 5, wherein a length of the PCB measured between another edge of the PCB that is opposite and the edge of the PCB corresponds to a first length that is smaller than a minimum length associated with a slot of a host device.

8. The system of claim 7, wherein a height of the metal bracket measured between the base portion and the vertex portion when combined with the length of the PCB corresponds to the minimum length associated with the slot.

9. The system of claim 7, wherein the minimum length comprises 80 millimeters, and wherein the length of the PCB comprises 30 millimeters or 42 millimeters.

10. The system of claim 1, wherein the vertex portion is configured to be physically attached to a host device via a screw and is configured to dissipate heat to the host device via the screw.

11. The system of claim 1, wherein the metal bracket is configured to increase a stiffness of the PCB and absorb shock.

12. The system of claim 1, wherein the metal bracket comprises a heat sink.

13. The system of claim 1, comprising:
a heat spreader thermally coupled to one or more components of the PCB and thermally coupled to the metal bracket via the base portion.

14. The system of claim 13, wherein the heat spreader is thermally coupled to the one or more components of the PCB via a top portion of the PCB.

15. The system of claim 14, wherein the heat spreader is a first heat spreader, comprising a second heat spreader thermally coupled to a bottom portion of the PCB and thermally coupled to the metal bracket via the base portion.

16. A method comprising:
measuring temperature of at least one of a processing device or a set of memory components implemented on a printed circuit board (PCB), a metal bracket being physically attached to an edge of the PCB at a base portion of the metal bracket, the metal bracket being thermally coupled to the set of memory components and the processing device of the PCB via the base portion, and the metal bracket being configured to dissipate heat from the processing device and the set of memory components through a vertex portion of the metal bracket; and
adjusting a data transfer rate based on the measured temperature of the at least one of the processing device or the set of memory components.

17. The method of claim 16, wherein a PCB comprises an M.2 interface through which the set of memory components and the processing device communicate with a host device, the M.2 interface being implemented on the PCB on an opposite end from the edge of the PCB to which the metal bracket is physically attached.

18. The method of claim 16, wherein the PCB includes a plurality of layers, the plurality of layers comprising a ground layer, and wherein the set of memory components and the processing device are both coupled to the metal bracket through the ground layer.

19. The method of claim 16, wherein the metal bracket comprises a triangular shaped metal bracket physically attached to the edge of the PCB using a thermal epoxy.

20. A method of manufacturing a printed circuit board (PCB) comprising a memory system, the method comprising:
placing a processing device on a first portion of the PCB;
placing a set of memory components of the memory system on a second portion of the PCB;
physically attaching a metal bracket to the PCB by fitting a round protruding portion of a base of the metal bracket to a round recessed portion of the PCB, the metal bracket being configured to dissipate heat from the processing device and the set of memory components through a vertex portion of the metal bracket; and
coupling the processing device and the set of memory components through a ground layer of the PCB to the metal bracket.

* * * * *